United States Patent [19]

Zhang et al.

[11] Patent Number: 5,614,733
[45] Date of Patent: Mar. 25, 1997

[54] SEMICONDUCTOR DEVICE HAVING CRYSTALLINE THIN FILM TRANSISTORS

[75] Inventors: Hongyong Zhang; Toru Takayama; Yasuhiko Takemura, all of Kanagawa, Japan

[73] Assignee: Semiconductor Energy Laboratory Co., Inc., Kanagawa, Japan

[21] Appl. No.: 354,502

[22] Filed: Dec. 12, 1994

Related U.S. Application Data

[62] Division of Ser. No. 207,185, Mar. 8, 1994, Pat. No. 5,569,610.

[30] Foreign Application Priority Data

Mar. 12, 1993 [JP] Japan .................................. 5-079004
Mar. 12, 1993 [JP] Japan .................................. 5-079005

[51] Int. Cl.$^6$ .......................... H01L 29/76; H01L 31/036; H01L 31/112
[52] U.S. Cl. .............................. 257/66; 257/72; 257/607
[58] Field of Search .................... 257/57–60, 66, 257/72, 347, 350–353, 607

[56] References Cited

U.S. PATENT DOCUMENTS

| 4,746,628 | 5/1988 | Takafuji et al. | 257/352 |
| 5,147,826 | 9/1992 | Liu et al. | 437/233 |
| 5,275,851 | 1/1994 | Fonash et al. | 427/578 |
| 5,403,772 | 4/1995 | Zhang et al. | 437/101 |
| 5,426,064 | 6/1995 | Zhang et al. | 437/40 |

FOREIGN PATENT DOCUMENTS

2-208635  8/1990  Japan .

OTHER PUBLICATIONS

C. Hayzelden et al., "In Situ Transmission Electron Microscopy Studies of Silicide–Mediated Crystallization of Amorphous Silicon" (3 pages), Appl. Phys. Lett., vol. 6, No. 2, Jan. 13, 1992, 225–227.

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

"Crystallized Si Films By Low–Temperature Rapid Thermal Annealing of Amorphous Silicon", R. Kakkad, J. Smith, W.S. Lau, S.J. Fonash, J. Appl. Phys. 65(5), Mar. 1, 1989, 1989 American Institute of Physics, p. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, p. 2554–2556.

"Selective Area Crystallization of Amorphous Silicon Films by Low–Temperature Rapid Thermal Annealing", Gang Liu and S.J. Fonash, Appl. Phys. Lett. 55 (7), Aug. 14, 1989, 1989 American Institute of Physics, p. 660–662.

"Low Temperature Selective Crystallization of Amorphous Silicon", R. Kakkad, G. Liu, S.J. Fonash, Journal of Non-Crystalline Solids, vol. 115, (1989), p. 66–68.

*Primary Examiner*—Sara W. Crane
*Attorney, Agent, or Firm*—Sixbey, Friedman, Leedom & Ferguson; Gerald J. Ferguson, Jr.; Karlton C. Butts

[57] ABSTRACT

A semiconductor device has a first thin film transistor and a second thin film transistor formed on a substrate. Both of the first and second thin film transistor have a crystallized channel region. One of the first and second thin film transistor is doped with a catalyst metal at a sufficient concentration for promoting the crystallization of the channel region which the other of the first and second thin film transistors is not doped with the catalyst metal.

13 Claims, 5 Drawing Sheets

5,614,733

SEMICONDUCTOR DEVICE HAVING CRYSTALLINE THIN FILM TRANSISTORS

This is a Divisional application of Ser. No. 08/207,185, filed Mar. 8, 1994, U.S. Pat. No. 5,569,610.

FIELD OF THE INVENTION

The present invention relates to thin-film transistors (TFTs) and also to a method of fabricating TFTs. Furthermore, the invention relates to a semiconductor circuit using plural TFTs and also to a method of fabricating such a semiconductor circuit. A thin-film transistor fabricated according to the present invention is formed either on an insulating substrate of glass or the like or on a semiconductor substrate of a single crystal of silicon. Especially, where the invention is applied to a semiconductor circuit comprising a low-speed matrix circuit and a high-speed peripheral circuit for driving the matrix circuit such as a monolithic active-matrix circuit used in a liquid-crystal display or the like, great advantages can be obtained.

BACKGROUND OF THE INVENTION

In recent years, an insulated gate semiconductor device having an active layer (also called an active region) in the form of a thin film has been investigated. Especially, an insulated-gate transistor in the form of a thin film which is known as a TFT has been earnestly investigated. Transistors of this kind are formed on a transparent insulating substrate and used either to control each pixel in a display device such as a liquid-crystal display having a matrix structure or to form a driver circuit. Depending on the material or the state of crystallization of the used semiconductor, they are classified as amorphous silicon TFTs or crystalline silicon TFTs.

Generally, amorphous semiconductors have small field mobilities and so they cannot be used in TFTs which are required to operate at high speeds. Accordingly, in recent years, crystalline silicon TFTs have been investigated and developed to fabricate circuits of higher performance.

Since crystalline semiconductors have higher field mobilities than amorphous semiconductors, the crystalline semiconductors are capable of operating at higher speeds. With respect to crystalline silicon, PMOS TFTs can be fabricated, as well as NMOS TFTs. For example, it is known that the peripheral circuit of an active-matrix liquid-crystal display is composed of CMOS crystalline TFTs similarly to the active-matrix circuit portion. That is, this has a monolithic structure.

FIG. 3 is a block diagram of a monolithic active-matrix circuit used in a liquid-crystal display. A column decoder 1 and a row decoder 2 are formed on a substrate 7 to form a peripheral driver circuit. Pixel circuits 4 each consisting of a transistor and a capacitor are formed in a matrix region 3. The matrix region is connected with the peripheral circuit by conductive interconnects 5 and 6. TFTs used in the peripheral circuit are required to operate at high speeds, while TFTs used in the pixel circuits are required to have a low-leakage current. These are conflicting characteristics in terms of physics but it is necessary that these two kinds of TFTs be formed on the same substrate at the same time.

However, all TFTs fabricated by the same process show similar characteristics. For example, TFTs using crystalline silicon fabricated by thermal annealing, TFTs used in the matrix region, and TFTs in the peripheral driver circuit all have similar characteristics. It has been difficult to obtain a low-leakage current suited for the pixel circuits and a high mobility adapted for the peripheral driver circuit at the same time. It has been possible to solve the above difficulty by using thermal annealing and crystallization using selective laser annealing at the same time. In this case, TFTs fabricated by thermal annealing can be used in the matrix region, whereas TFTs fabricated by laser annealing can be employed in the peripheral driver circuit region. However, the crystallinity of silicon crystallized by laser annealing has quite low homogeneity. Especially, it is difficult to use these TFTs in a peripheral driver circuit which is required to be defect-free.

It is also possible to use crystallization relying on laser annealing in order to obtain crystalline silicon. If a semiconductor circuit is fabricated from this silicon crystallized by laser annealing, TFTs in the matrix region and TFTs in the peripheral driver circuit all have similar characteristics. Accordingly, an alternative method of crystallizing silicon may be contemplated. In particular, TFTs in the matrix region are formed, using thermal annealing. TFTs in the peripheral driver circuit are formed, using laser annealing. However, where the thermal annealing is adopted, the silicon must be annealed at 600° C. for as long as 24 hours, or the silicon must be annealed at a high temperature exceeding 1000° C. In the former method, the throughput drops. In the latter method, the material of the usable substrate is limited to quartz.

SUMMARY OF THE INVENTION

It is an object of the present invention to provide a method of fabricating a semiconductor circuit without relying on a complex process or without deteriorating the production yield or the cost.

It is another object of the invention to provide a method of easily mass-producing two kinds of TFTs with minimum variations in the process, one of the two kinds being required to have a high mobility, the other being required to have a low-leakage current.

Our research has revealed that addition of a trace amount of a catalytic material to a substantially amorphous silicon film promotes crystallization, lowers the crystallization temperature, and shortens the crystallization time. Examples of the catalytic material include simple substances of nickel (Ni), iron (Fe), cobalt (Co), and platinum, and silicides thereof. More specifically, a film containing such a catalytic element, particles of the element, or clusters of the element are used to form a first film on or under an amorphous silicon film such that the first film is in intimate contact with the amorphous silicon film. Alternatively, such a catalytic element is implanted into an amorphous silicon film by ion implantation or other method. Then, the film is thermally annealed at an appropriate temperature, typically below 580° C., in a short time within 8 hours. As a result, the amorphous film is crystallized.

Where a film is fabricated from such a catalytic element, the concentration of the element is sufficiently low and so the film is quite thin. To form this film, a method using a vacuum pump such as sputtering or vacuum evaporation can be employed. In addition, a method which can be effected under atmospheric pressure such as spin coating or dipping can be utilized. This atmospheric-pressure method is easy to perform and provides high productivity. In this case, an acetate, a nitrate, an organic salt, or the like containing such a catalytic element is dissolved in an appropriate solvent, and the concentration is adjusted to an adequate value.

When the amorphous silicon film is formed by CVD, the catalytic material is added to the raw material gases. When the amorphous silicon film is formed by physical vapor deposition such as sputtering, the catalytic material may be added to the target or evaporation source for forming a film. Of course, as the anneal temperature rises, the crystallization time decreases. Furthermore, as the concentrations of nickel, iron, cobalt, and platinum are increased, the crystallization temperature drops, and the crystallization time is shortened. Our research has revealed that it is necessary that the concentration of at least one of these elements be in excess of $10^{17}$ cm$^{-3}$, in order to promote crystallization. Preferably, the concentration is in excess of $5\times10^{18}$ cm$^{-3}$.

Since all of the aforementioned catalytic materials are not desirable for silicon, it is desired that their concentrations be made as low as possible. Our research has shown that the total concentration of these catalytic materials is preferably not in excess of $1\times10^{20}$ cm$^{-3}$. Also local concentrations (e.g. those at grain boundaries) are preferably not in excess of $1\times10^{20}$ cm$^{-3}$.

In the present invention, TFTs which operate at high speeds and are used as TFTs for driving an active-matrix circuit are selectively formed by laser crystallization. On the other hand, TFTs which operate at relatively low speeds and are used as low-leakage current TFTs of pixels of the active-matrix circuit are fabricated by making positive use of the features of crystallization promoted by the catalytic elements described above. To form the latter TFTs, silicon is crystallized at a low temperature in a short time. As a result, a circuit comprising transistors that achieve both low-leakage current and high-speed operation which would normally be conflicting characteristics can be formed on the same substrate.

We also discovered that when a film containing catalytic elements such as nickel, iron, cobalt, platinum, and palladium is irradiated with laser light or other equivalent intense light, a quite rapid crystal growth takes place even if the concentration of the catalytic elements is much smaller than the concentration which would normally be needed to effect crystallization in a thermal equilibrium state. Typically, the former concentration is less than one tenth the latter concentration.

More specifically, the crystallization can be promoted by setting the concentration of these catalytic elements to $1\times10^{15}$ to $1\times10^{19}$ cm$^{-3}$, preferably $1\times10^{18}$ to $5\times10^{17}$ cm$^{-3}$. The film is then irradiated with laser light of an appropriate energy or other equivalent intense light. The energy density of the laser light or other equivalent intense light varies, depending on the wavelength of the irradiating light, the pulse duration, the temperature of the amorphous silicon film (or crystalline silicon), and other factors. For example, if the temperature of the amorphous silicon is set to 100° to 450° C., preferably 250° to 350° C., then crystallization can be accomplished with a less concentration of catalytic elements.

In the present invention, an amorphous silicon film is formed by utilizing the features of crystallization using the above-described catalytic materials. A film made of a material containing the catalytic elements is in intimate contact with the amorphous silicon film, or the elements are added to the amorphous silicon film. Then, the amorphous film is irradiated with laser light or other equivalent intense light to crystallize the amorphous silicon film. At this time, the material containing the catalytic elements is brought into intimate contact with selected portions of a substrate or introduced into these portions. Subsequently, the film is irradiated or scanned with laser light or other equivalent intense light. In this way, silicon films having different degrees of crystallinity can be formed on the same substrate. It is also possible to make a preliminary anneal at 350°–650° C., preferably 400°–550° C., for 1 to 24 hours, preferably 2 to 8 hours, before the laser irradiation.

In this manner, the crystallinity can be improved. Furthermore, barriers at gain boundaries which could not be removed if only thermal annealing is conducted can be lowered. In addition, even amorphous components remaining at the grain boundaries can be crystallized. Where this method is adopted, even if the crystallinity achieved by thermal annealing is low, complete crystal can be accomplished by subsequent laser irradiation. Hence, the concentration of the used catalytic elements can be lowered.

In the present invention, the crystallinity of regions doped with catalytic elements is improved by the subsequent laser irradiation over the crystallinity of regions less doped with the catalytic elements, whether the preliminary anneal is carried out or not before the laser irradiation. Furthermore, the obtained TFTs show characteristics comparable or superior to those of TFTs fabricated by the conventional laser annealing in which an amorphous silicon film is irradiated with laser light. Additionally, these characteristics are obtained stably by making the energy of the laser light or other equivalent intense light less than the energy of laser light used in conventional laser annealing. On the other hand, regions not doped with the catalytic elements can be crystallized by laser irradiation. Also in this case, stable characteristics are derived by making the energy of the laser light or other equivalent intense light less than the energy of laser light used in conventional laser annealing. Of course, the characteristics of the region not doped with the catalytic elements are inferior to those of the regions doped with the catalytic elements.

By making use of these features, the regions lightly doped with the catalytic elements are used to form low-leakage current TFTs in the pixel circuits of an active-matrix circuit. The regions heavily doped with the catalytic elements can be used to form high-speed TFTs which are used in the peripheral driver circuit. As a result, a circuit comprising transistors that achieve both low-leakage current and high-speed operation which would normally be conflicting characteristics can be formed on a substrate.

In the present invention, it is necessary that the concentration of the catalytic elements in portions forming TFTs which are required to have low-leakage current be lower than the concentration of the catalytic elements in portions forming high-speed TFTs. In order to make their difference greater or to lower the leakage-current further, the concentration of the catalytic elements in the active regions of the TFTs which are required to have low-leakage current is preferably less than $1\times10^{15}$ cm$^{-3}$.

Other objects and features of the invention will appear in the course of the description thereof, which follows.

DETAILED DESCRIPTION OF THE INVENTION

EXAMPLE 1

Figure 1A:
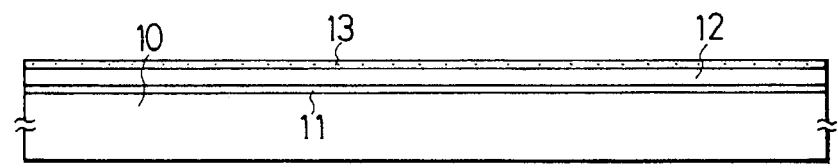
FIGS. 1(A) to 1(E) are cross-sectional views of a semiconductor circuit according to Example 1 of the present invention, illustrating steps successively performed to fabricate the semiconductor circuit.
Figure 1B:
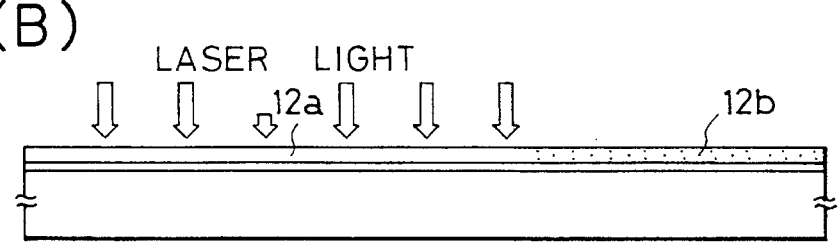
Figure 1C:
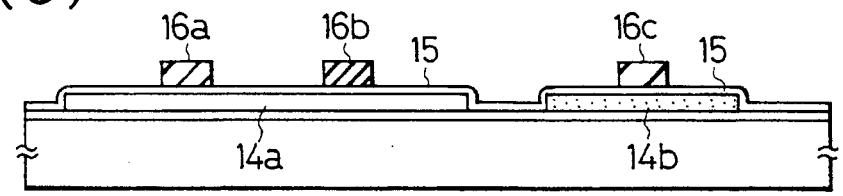
Figure 1D:
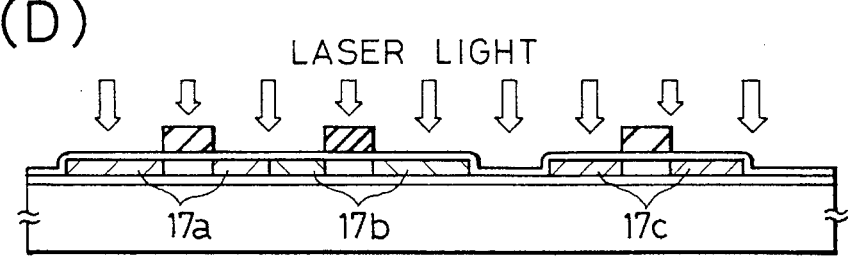
Figure 1E:
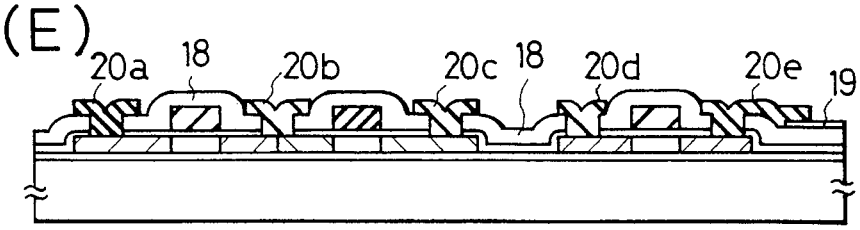
Figure 2A:
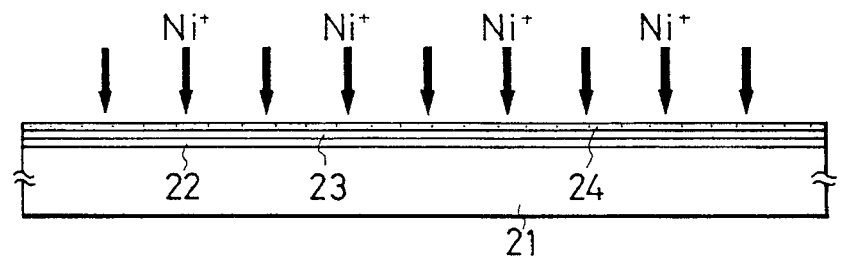
FIGS. 2(A) to 2(E) are cross-sectional views similar to FIGS. 1(A) to 1(E) but illustrating a semiconductor device according to Example 2.
Figure 2B:
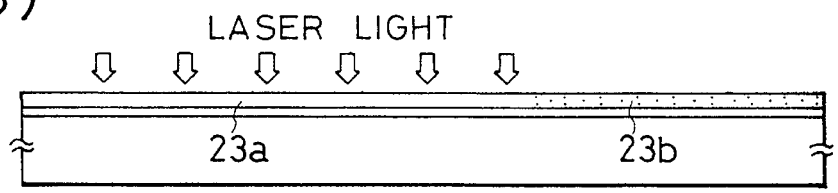
Figure 2C:
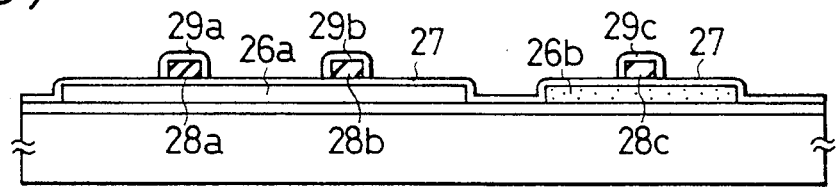
Figure 2D:
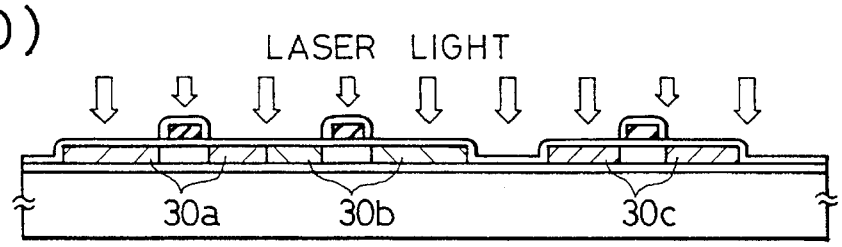
Figure 2E:
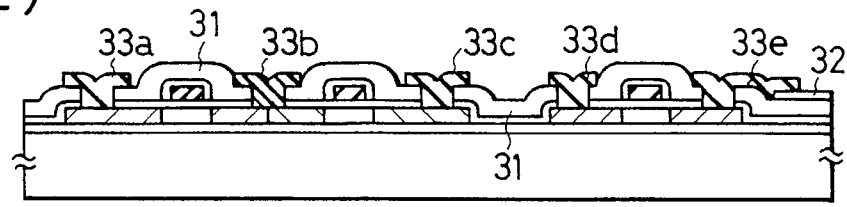
Figure 3:
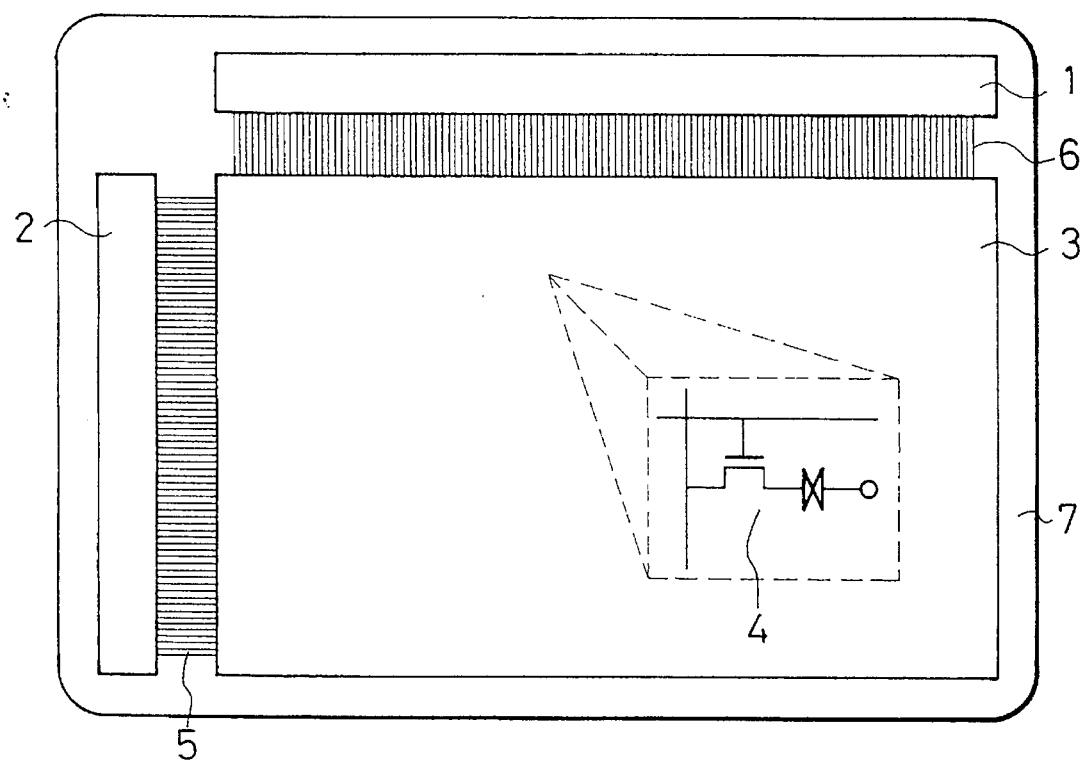
FIG. 3 is a diagram of a monolithic active-matrix circuit.
Figure 4A:
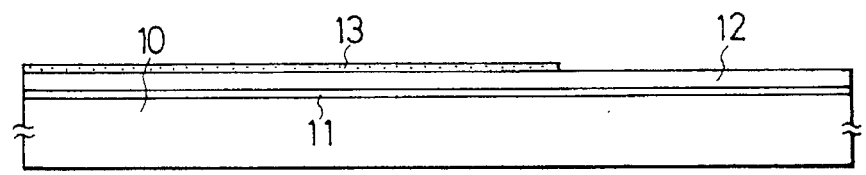
FIGS. 4(A) to 4(E) are cross-sectional views of a semiconductor circuit according to Example 3 of the present invention, illustrating steps successively performed to fabricate the semiconductor circuit.
Figure 4B:
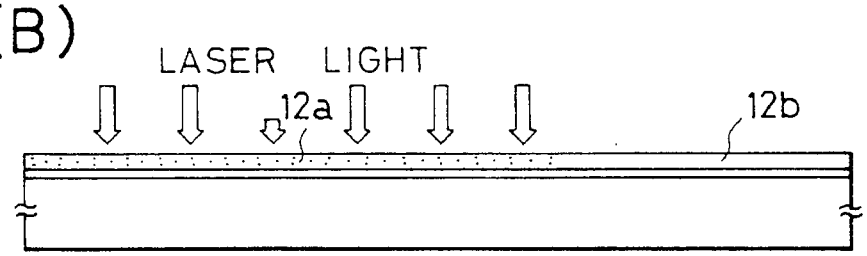
Figure 4C:
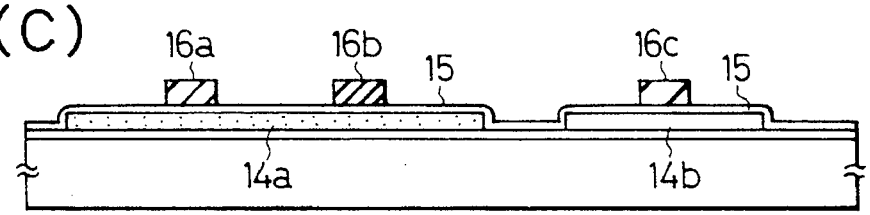
Figure 4D:
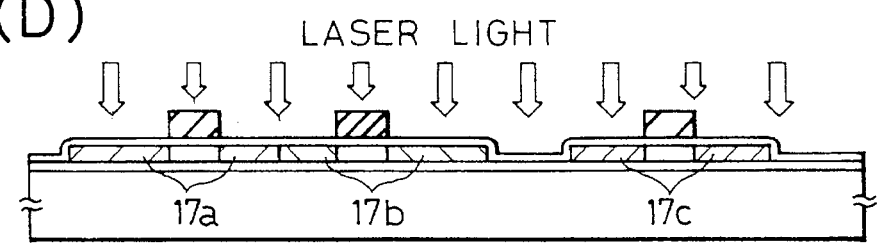
Figure 4E:
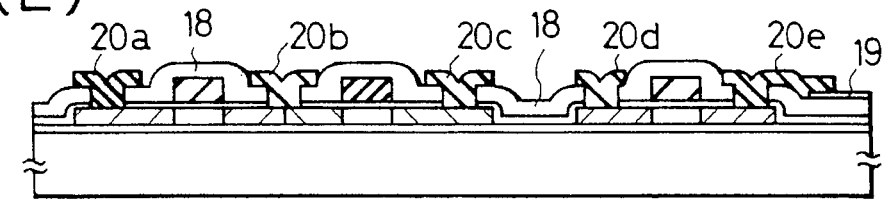
Figure 5A:
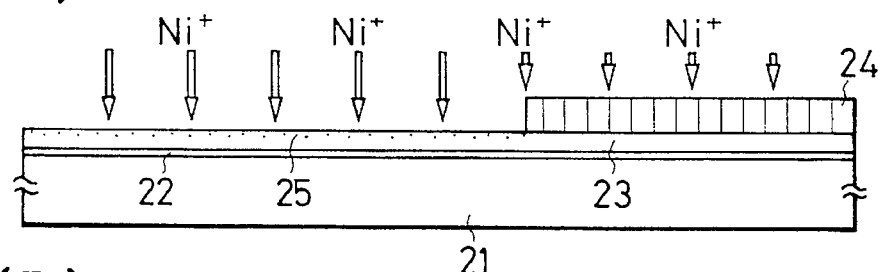
FIGS. 5(A) to 5(E) are cross-sectional views similar to FIGS. 4(A) to 4(E) but illustrating a semiconductor device according to Example 4.
Figure 5B:
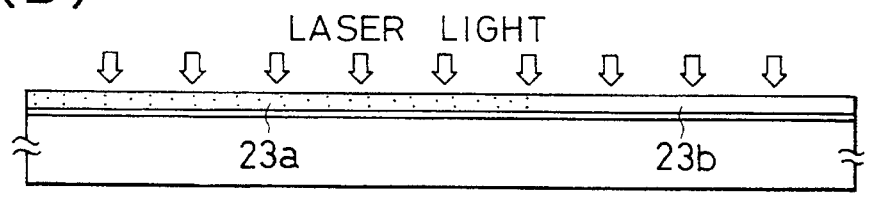
Figure 5C:
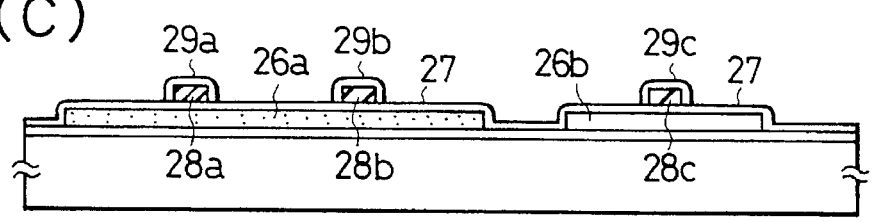
Figure 5D:
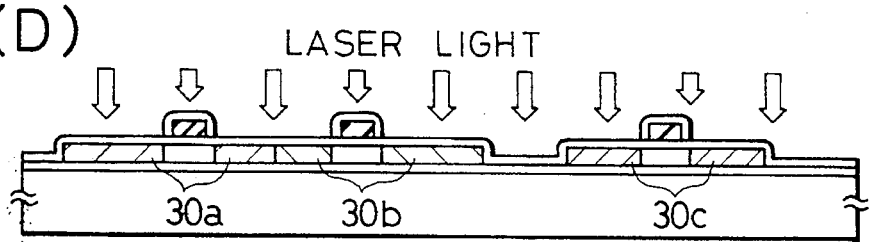
Figure 5E:
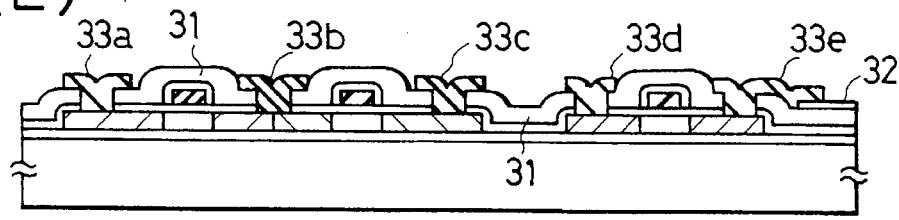

The present example relates to a semiconductor circuit comprising an active-matrix circuit formed on a single substrate of glass and a driver circuit formed around the active-matrix circuit as shown in FIG. 3. FIG. 1, (A)–(E), are cross-sectional views of the semiconductor circuit according to the present example, illustrating steps successively performed to fabricate the device. First, silicon oxide was sputtered as a base film 11 to a thickness of 2000 Å on a substrate 10 made of Corning 7059. An intrinsic amorphous silicon film 12 having a thickness of 500 to 1500 Å, e.g., 1500 Å, was formed on the silicon oxide film 11 by LPCVD. Immediately thereafter, nickel silicide was deposited as a film 13 having a thickness of 5 to 200 Å, e.g., 20 Å, by sputtering (FIG. I(A)). The nickel silicide film 13 is given by the chemical formula $NiSi_x$; $0.4 \leq x \leq 2.5$, e.g., $x=2.0$.

Then, the laminate was selectively irradiated with laser light to crystallize the selected regions. A KrF excimer laser emitting light having a wavelength of 248 nm and a pulse duration of 20 nsec was used for the irradiation. Other lasers such as an XeF excimer laser emitting light having a wavelength of 353 nm, an XeCl excimer laser emitting light having a wavelength of 308 nm, an ArF excimer laser emitting light having a wavelength of 193 nm, and other lasers may be used. The energy density of the laser light was 200 to 500 mJ/cm$^2$, e.g. 350 mJ/cm$^2$. Two to ten shots, e.g., 2 shots, of the laser light were emitted for each location. During the laser irradiation, the substrate was heated to 200° to 450° C., e.g., 300° C.

As can be seen from FIG. 3, the peripheral circuit region which would be crystallized by laser irradiation is spaced a considerable distance from the matrix region which suffices to be treated by thermal annealing. Therefore, no photolithography step was needed.

Thereafter, the laminate was annealed at 500° C. for 4 hours in a reducing ambient to crystallize the regions (the pixel circuits of the active-matrix circuit) which were not irradiated with the laser light. As a result, two kinds of crystalline silicon regions 12a and 12b were obtained. The field mobility of the regions 12a was enhanced by the laser crystallization step. On the other hand, the regions 12b crystallized by the thermal annealing had low-leakage current (FIG. 1(B)).

The silicon film derived in this way was patterned photolithographically to form silicon island regions 14a forming a peripheral driver circuit and silicon island regions 14b forming a matrix region. Silicon oxide was deposited as a gate-insulating film 15 having a thickness of 1000 Å by sputtering. A target consisting of silicon oxide was used during the sputtering process. The substrate temperature was 200° to 400° C., e.g., 350° C., during the sputtering. The ambient of the sputtering consisted of oxygen and argon. The ratio of the argon to the oxygen was between 0 and 0.5, e.g., less than 0.1. Silicon containing 0.1–2% phosphorus was deposited to a thickness of 6000 to 8000 Å, e.g., 6000 Å, by LPCVD to form a silicon film. Preferably, the step of forming the silicon oxide film and the step of forming the silicon film are carried out in succession. The silicon film was patterned to form gate electrodes 16a, 16b, and 16c (FIG. 1(C)).

Then, masking the silicon region with the gate electrodes, impurities consisting of phosphorus and boron were implanted into the silicon regions by plasma doping. Phosphine ($PH_3$) and diborane ($B_2H_6$) were used as dopant gases. Where the former gas was used, the accelerating voltage was 80 to 90 kV, e.g., 80 kV. Where the latter gas was used, the accelerating voltage was 40 to 80 kV, e.g., 65 kV. The dose was $1\times10^{15}$ to $8\times10^{15}$ cm$^{-2}$. In the case of phosphorus, the dose was $2\times10^{15}$ cm$^{-2}$. In the case of boron, the dose was $5\times10^{15}$ cm$^{-2}$. As a result, N-type doped regions 17a, P-type doped regions 17b and 17c were formed.

Subsequently, the impurities were activated by laser annealing. A KrF excimer laser emitting light having a wavelength of 248 nm and a pulse duration of 20 nsec was used for the laser annealing. Other lasers such as an XeF excimer laser emitting light having a wavelength of 353 nm, an XeCl excimer laser emitting light having a wavelength of 308 nm, an ArF excimer laser emitting light having a wavelength of 193 nm, and other lasers may be used. The energy density of the laser light is 200 to 400 mJ/cm$^2$ e.g., 250 mJ/cm$^2$. Two to ten shots, e.g., 2 shots, of the laser light were emitted for each location. During the laser irradiation, the substrate might be heated to 200° to 450° C. Instead of the laser irradiation, the laminate can be annealed at 450° to 500° C. for 2 to 8 hours. In this way, the doped regions 17a–17c were activated (FIG. 1(D)).

Thereafter, silicon oxide was deposited as an interlayer insulator 18 having a thickness of 6000 Å by plasma CVD. Then, indium tin oxide (ITO) was sputtered to a thickness of 500 to 1000 Å, e.g., 800 Å, and patterned to form pixel electrodes 19. Contact holes were formed in the interlayer insulator 18. Electrodes and conductive interconnects 20a, 20b, 20c for TFTs forming a peripheral driver circuit and electrodes and conductive interconnects 20d, 20e for TFTs forming matrix pixel circuits were formed from a multilayer film of metal materials, e.g., titanium nitride and aluminum. Finally, the laminate was annealed at 350° C. for 30 minutes at 1 atm. in a hydrogen ambient. In this way, a semiconductor circuit was completed (FIG. 1(E)).

The concentration of nickel in the active regions of the obtained TFTs was measured by secondary ion mass spectroscopy (SIMS). The concentration was $1\times10^{18}$ to $5\times10^{18}$ cm$^{-3}$ for both peripheral driver circuit and pixel circuits.

EXAMPLE 2

FIG. 2, (A)–(E), are cross-sectional views illustrating steps successively performed to fabricate the present example. Silicon oxide was sputtered as a silicon oxide film 22 having a thickness of 2000 Å on a substrate 21 made of Corning 7059. Then, an amorphous silicon film 23 having a thickness of 200 to 1500 Å, e.g., 500 Å, was formed on the silicon oxide film 22 by LPCVD. Nickel ions were implanted to form regions 24 in the surface of the amorphous silicon film, the regions 24 being doped with nickel at a concentration of $1\times10^{18}$ to $2\times10^{19}$ cm$^{-3}$, e.g., $5\times10^{18}$ cm$^{-3}$. The depth of the doped regions 24 was 200 to 500 Å. The accelerating energy was selected according to the depth of the doped regions (FIG. 2(A)).

Then, the amorphous silicon film was selectively irradiated with laser light to crystallize the selected portions. A KrF excimer laser emitting light having a wavelength of 248 nm and a pulse duration of 20 nsec was used for the laser irradiation. The energy density of the laser light was 200 to 500 mJ/cm$^2$, e.g., 350 mJ/cm$^2$. Two to ten shots, e.g., 2 shots, of the laser light were emitted for each location. During the laser irradiation, the substrate was heated to 200° to 450° C., e.g., 400° C. The laminate was annealed at 500° C. for 4 hours in a reducing ambient to crystallize the non-irradiated portions of the amorphous silicon film. As a result of this crystallization step, two kinds of crystalline silicon 23a and 23b were obtained (FIG. 2(B)).

Thereafter, the silicon film was patterned to form silicon island regions 28a (peripheral driver circuit region) and 28b (matrix pixel circuit region). As the gate-insulating film of TFTs, a silicon oxide film 27 having a thickness of 1000 Å was formed from tetraethoxysilane (TEOS; Si(OC$_2$H$_5$)$_4$) and oxygen. Trichloroethylene (C$_2$HCl$_3$) was added to the raw material gases. Before the formation of the film, oxygen was supplied into the chamber at a flow rate of 400 SCCM. A plasma was produced at a substrate temperature of 300° C., at a total pressure of 5 Pa, and at an RF power of 150 W. This condition was maintained for 10 minutes. Subsequently, oxygen, TEOS, and trichloroethylene were admitted into the chamber at 300 SCCM, 15 SCCM, and 2 SCCM, respectively. In this way, a silicon oxide film was formed. The temperature of the substrate was 300° C. The RF power was 75 W. The total pressure was 5 Pa. After completion of the film, hydrogen was introduced into the chamber at a pressure of 100 torr. The laminate was annealed at 350° C. for 35 minutes.

Subsequently, aluminum containing 2% silicon was deposited as an aluminum film having a thickness of 6000 to 8000 Å, e.g., 6000 Å, by sputtering. Tantalum, tungsten, titanium, or molybdenum may be used instead of aluminum. Preferably, the step for forming the silicon oxide film 27 and the step for forming the aluminum film are carried out in succession. The aluminum film was patterned to form gate electrodes 28a, 28b, and 28c of TFTs. The surfaces of the aluminum interconnects were anodized to form oxide layers 29a, 29b, and 29c on the surfaces. The anodization was conducted within 1–5% ethylene glycol solution of tartaric acid. The thickness of the obtained oxide layers was 2000 Å (FIG. 2(C)).

Then, impurities, or phosphorus, were implanted into the silicon regions by plasma doping. Phosphine (PH$_3$) was used as a dopant gas. The accelerating voltage was 60 to 90 kV, e.g., 80 kV. The dose was 1×10$^{15}$ to 8×10$^{15}$ cm$^{-2}$ e.g., 2×10$^{15}$ cm$^{-2}$. In this way, N-type doped regions 30a were formed. Masking the left TFT (N-channel TFT) with a photoresist, impurities, or boron, were implanted into the silicon regions of the right peripheral circuit region TFT and into the silicon regions of the TFTs forming the matrix circuit again by plasma doping. Diborane (B$_2$H$_6$) was used as a dopant gas. The accelerating voltage was 50 to 80 kV, e.g., 65 kV The dose was 1×10$^{15}$ to 8×10$^{15}$ cm$^{-2}$, e.g., 5×10$^{15}$ cm$^{-2}$ which was larger than the dose of the previously implanted phosphorus. In this manner, P-type doped regions 30b and 30c were formed.

Then, the impurities were activated by laser annealing. A KrF excimer laser emitting light having a wavelength of 248 nm and a pulse duration of 20 nsec was used for the laser irradiation. The energy density of the laser light was 200 to 400 mJ/cm$^2$ e.g., 250 mJ/cm$^2$. Two to ten shots, e.g., 2 shots, of the laser light were emitted for each location (FIG. 2(D)).

Subsequently, a silicon oxide film 31 having a thickness of 2000 Å was formed as an interlayer insulator from TEOS by plasma CVD. Indium tin oxide (ITO) was deposited as an indium tin oxide film having a thickness of 500 to 1000 Å, e.g., 800 Å, by sputtering. This film was etched to form pixel electrodes 32. Contact holes were formed in the interlayer insulator 31. Source and drain electrodes, conductive interconnects 33a, 33b, 33c for the TFTs of the peripheral driver circuit and electrodes and conductive interconnects 33d, 33e for the TFTs of the matrix pixel circuit were formed from a multilayer film of metal materials, e.g., titanium nitride and aluminum. In this way, a semiconductor circuit was completed (FIG. 2(E)).

The characteristics of the TFTs of the peripheral driver circuit of the manufactured semiconductor circuit were by no means inferior to the characteristics of TFTs fabricated by prior art laser crystallization. A shift register was built, using these TFTs according to the present example. We have confirmed that this shift register operates at 11 MHz with a drain voltage of 15 V and at 16 MHz with a drain voltage of 17 V. Also, in a reliability test, no difference could be observed between the novel TFTs and TFTs fabricated by the prior art method. With respect to the characteristics of the TFTs in the matrix region (pixel circuits), the leakage current was less than 10$^{-13}$ A.

EXAMPLE 3

FIG. 4, (A)–(E), are cross-sectional views of a semiconductor circuit, illustrating steps successively performed to fabricate the circuit according to the present example. First, silicon oxide was sputtered as a base layer 11 having a thickness of 2000 Å on a substrate 10 made of Corning 7059. An amorphous silicon film 12 of the intrinsic (I) type having a thickness of 500 to 1500 Å, e.g., 500 Å, was formed on the base layer 11 by plasma CVD. Immediately thereafter, a silicon film 13 having a thickness of 5 to 200 Å, e.g., 50 Å, and containing nickel at a concentration of 1×10$^{18}$ cm$^{-3}$ was selectively formed by sputtering as shown. A lift-off process was used to fabricate this nickel film 13. Instead of sputtering, spin-coating can be used (FIG. 4(A)).

The whole surface of the amorphous silicon film 12 was irradiated with laser light to crystallize it. For this laser irradiation, a KrF excimer laser emitting light having a wavelength of 248 nm and a pulse duration of 20 nsec was used.

Other lasers such as an XeF excimer laser having a wavelength of 353 nm, an XeCl excimer laser having a wavelength of 308 nm, an ArF excimer laser having a wavelength of 193 nm, and other lasers may be used. The energy density of the laser light is 200 to 500 mJ/cm$^2$ e.g., 350 mJ/cm$^2$. Two to ten shots, e.g., 2 shots, of the laser light were emitted for each location. During the laser irradiation, the substrate was heated to 100 to 450° C., e.g., 300° C. As a result, the whole surface of the amorphous silicon film was crystallized. However, the crystallinity of those portions of the silicon film 12a which were located under the silicon nickel film 13 was better than the crystallinity of the silicon film 12b in the other regions because the nickel promoted crystallization (FIG. 4(B)).

The silicon film was photolithographically patterned to form silicon island regions 14a (peripheral driver circuit region) and 14b (matrix region). Silicon oxide was deposited as a gate-insulating film 15 having a thickness of 1000 Å by sputtering. A target consisting of silicon oxide was used during the sputtering process. In this process, the temperature of the substrate was 200° to 400° C., e.g., 350° C. The sputtering ambient consisted of oxygen and argon. The ratio of the argon to the oxygen was between 0 and 0.5, e.g., less than 0.1. Subsequently, a silicon film having a thickness of 3000 to 8000 Å, e.g., 6000 Å, and containing 0.1 to 2% phosphorus was formed by LPCVD. Preferably, the step for forming the silicon oxide film 15 and the step for forming the silicon film are carried out in succession. The silicon film was patterned to form gate electrodes 16a, 16b, and 16c (FIG. 4(C)).

Then, using the gate electrodes as a mask, impurities, or phosphorus and boron, were implanted into the silicon regions by plasma doping. Phosphine ($PH_3$) and diborane ($B_2H_6$) were used as dopant gases. Where phosphine was used, the accelerating voltage was 60 to 90 kV, e.g., 80 kV. Where diborane was used, the accelerating voltage was 40 to 80 kV, e.g., 65 kV. The dose was $1\times10^{15}$ to $8\times10^{15}$ cm$^{-2}$. For example, phosphorus dose was $2\times10^{15}$ cm$^{-2}$. Boron dose was $5\times10^{15}$ cm$^{-2}$. As a result, N-type doped regions 17a, P-type doped regions 17b, 17c were formed.

Thereafter, the impurities were activated by laser annealing. For this laser annealing, a KrF excimer laser emitting light having a wavelength of 248 nm and a pulse duration of 20 nsec was used. Other lasers such as an XeF excimer laser emitting light having a wavelength of 353 nm, an XeCl excimer laser emitting light having a wavelength of 308 nm, an ArF excimer laser emitting light having a wavelength of 193 nm, and other lasers may be used. The energy density of the laser light was 200 to 400 mJ/cm$^2$ e.g., 250 mJ/cm$^2$. Two to ten shots, e.g., 2 shots, of the laser light were emitted for each location. During the laser annealing, the substrate was heated to 100° to 450° C., e.g., 250° C. In this way, the doped regions 17a–17c were activated (FIG. 4(D)).

Then, a silicon oxide film 18 having a thickness of 8000 Å was formed as an interlayer insulator by plasma CVD. An indium tin oxide (ITO) film having a thickness of 500 to 1000 Å, e.g., 800 Å, was formed by sputtering. This film was patterned to form pixel electrodes 19. Then, contact holes were formed in the interlayer insulator. Electrodes and conductive interconnects 20a, 20b, 20c of TFTs of a peripheral driver circuit and electrodes and conductive interconnects 20d, 20e of TFTs of a matrix pixel circuit were fabricated from a multilayer film of metal materials, e.g., titanium nitride and aluminum. Finally, the laminate was annealed at 350° C. for 30 minutes at 1 atm. in a hydrogen ambient. Thus, a semiconductor circuit was completed (FIG. 4(E)).

The concentration of nickel contained in the active regions of TFTs obtained in the present example was measured by SIMS. The concentration of nickel in the TFTs in the peripheral driver circuit was $1\times10^{17}$ to $5\times10^{17}$ cm$^{-3}$. The concentration of nickel in the TFTs in the pixel circuit was less than the lower limit of detection, which is $1\times10^{16}$ cm$^{-3}$.

EXAMPLE 4

FIG. 5, (A)–(E), are cross-sectional views of a semiconductor device, illustrating steps successively performed to fabricate the device according to the present example. A silicon oxide film 22 having a thickness of 2000 Å was formed on a substrate 21 made of Corning 7059 by sputtering. Then, an amorphous silicon film 23 having a thickness of 200 to 1500 Å, e.g., 500 Å was formed on the silicon oxide film 22 by plasma CVD. Nickel ions were selectively implanted into the amorphous silicon film 23 by ion implantation while masking this film with a photoresist 24. Thus, regions 25 containing nickel at a concentration of $1\times10^{15}$ to $1\times10^{18}$ cm$^{-3}$ e.g., $5\times10^{16}$ cm$^{-3}$ were formed. The depth of these regions 25 was 200 to 500 Å. The accelerating voltage was determined according to this depth. The use of ion implantation as in the present example is more effective in controlling the concentration of the nickel than the technique of Example 3 (FIG. 5(A)).

Then, the substrate was annealed at 350° to 850° C., preferably 400°–550° C., e.g., 500° C., for 2 hours in a nitrogen ambient. As a result, crystallization of the regions doped with the nickel progressed preliminarily. Then, the whole surface of the amorphous silicon film 23 was irradiated with laser light to crystallize these regions. For this laser irradiation, a KrF excimer laser emitting light having a wavelength of 248 nm and a pulse duration of 20 nsec was used. The energy density of the laser light was 200 to 500 mJ/cm$^2$ e.g., 350 mJ/cm$^2$. Two to ten shots, e.g., 2 shots, of the laser light were emitted for each location. During the laser irradiation, the substrate was heated to 100° to 450° C., e.g., 350° C. As a result, the silicon film was crystallized. Those regions 23a of the silicon film which were doped with nickel were superior in crystallinity to the undoped regions 23b (FIG. 5(B)).

Thereafter, the silicon film was patterned to form silicon island regions 28a (peripheral driver circuit region) and 28b (matrix pixel circuit region). A silicon oxide film 27 having a thickness of 1000 Å was formed as a gate-insulating film of TFTs by plasma CVD, using tetraethoxysilane (TEOS; $Si(OC_2H_5)_4$) and oxygen as raw materials. Trichloroethylene ($C_2HCl_3$) was added to the raw material gases. Before the formation of the film, oxygen was supplied into the chamber at a flow rate of 400 SCCM. A plasma was produced at a substrate temperature of 300° C., at a total pressure of 5 Pa, and at an RF power of 150 W. This condition was maintained for 10 minutes. Subsequently, oxygen, TEOS, and trichloroethylene were admitted into the chamber at 300 SCCM, 15 SCCM, and 2 SCCM, respectively. In this way, a silicon oxide film was formed. The temperature of the substrate was 300° C. The RF power was 75 W. The total pressure was 5 Pa. After completion of the film, hydrogen was introduced into the chamber at a pressure of 100 torr. The laminate was annealed at 350° C. for 35 minutes.

Subsequently, aluminum containing 2% silicon was deposited to a thickness of 6000 to 8000 Å, e.g., 6000 Å, by sputtering. Tantalum, tungsten, titanium, or molybdenum may be used instead of aluminum. Preferably, the step for forming the silicon oxide film 27 and the step for forming the aluminum film are carried out in succession. The aluminum film was patterned to form gate electrodes 28a, 28b, and 28c of TFTs. The surfaces of the aluminum interconnects were anodized to form oxide layers 29a, 29b, and 29c on the surfaces. The anodization was conducted within 1–5% ethylene glycol solution of tartaric acid. The thickness of the obtained oxide layers was 2000 Å (FIG. 5(C)).

Then, impurities, or phosphorus, were implanted into the silicon regions by plasma doping. Phosphine ($PH_3$) was used as a dopant gas. The accelerating voltage was 60 to 90 kV, e.g., 80 kV. The dose was $1\times10^{15}$ to $8\times10^{15}$ cm$^{-2}$ e.g., $2\times10^{15}$ cm$^{-2}$. In this way, N-type doped regions 30a were formed. Masking the left TFT (N-channel TFT) with a photoresist, impurities, or boron, were implanted into the silicon regions of the right peripheral circuit region TFT and into the silicon regions of the TFTs forming the matrix circuit again by plasma doping. Diborane ($B_2H_6$) was used as a dopant gas. The accelerating voltage was 50 to 80 kV, e.g., 65 kV. The dose was $1\times10^{15}$ to $8\times10^{15}$ cm$^{-2}$, e.g., $5\times10^{15}$ cm$^{-2}$ which was larger than the dose of the previously implanted phosphorus. In this manner, P-type doped regions 30b and 30c were formed.

Thereafter, the impurities were activated by laser annealing. For this laser annealing, a KrF excimer laser emitting light having a wavelength of 248 nm and a pulse duration of 20 nsec was used. The energy density of the laser light was 200 to 400 mJ/cm$^2$, e.g., 250 mJ/cm$^2$. Two to ten shots, e.g., 2 shots, of the laser light were emitted for each location (FIG. 2(D)).

Then, a silicon oxide film 31 having a thickness of 2000 Å was formed as an interlayer insulator from TEOS by plasma CVD. An indium tin oxide (ITO) film having a thickness of 500 to 1000 Å, e.g., 800 Å, was formed by sputtering. This film was patterned to form pixel electrodes 32. Then, contact holes were formed in the interlayer insulator 31. Electrodes and conductive interconnects 33a, 33b, 33c of TFTs of a peripheral driver circuit and electrodes and conductive interconnects 33d, 33e of TFTs of a matrix pixel circuit were fabricated from a multilayer film of metal materials, e.g., titanium nitride and aluminum. Thus, a semiconductor circuit was completed (FIG. 5(E)).

The characteristics of the TFTs of the peripheral driver circuit of the manufactured semiconductor circuit were never inferior to the characteristics of TFTs fabricated by prior art laser crystallization. A shift register was built, using these TFTs according to the present example. We have confirmed that this shift register operates at 11 MHz with a drain voltage of 15 V and at 16 MHz with a drain voltage of 17 V. Also, in a reliability test, no difference was observed between the novel TFTs and TFTs fabricated by the prior art method. With respect to the characteristics of the TFTs in the matrix region (pixel circuits), the leakage current was less than 10$^{-13}$ A.

The present invention makes it possible to fabricate TFTs capable of operating at a high speed and TFTs exhibiting low leakage current on the same substrate as described in the above examples. Where this structure is applied to a liquid-crystal display, it is easier to mass produce TFTs. Also, characteristics are improved. Of course, TFTs exhibiting only one of these two features can be fabricated on a substrate.

Furthermore, in the present invention, the throughput can be improved by crystallizing silicon at a low temperature, for example 500° C., and in a short time, for example 4 hours. Where a conventional process conducted above 600° C. is adopted, glass substrates have been shrunk and warped, leading to a decrease in the production yield. This problem is fully solved by making use of the present invention. This also means that a substrate having a large area can be treated in one operation. In particular, by slicing the substrate of a large area into numerous semiconductor circuits such as matrix circuits, the price of each circuit can be reduced greatly. In this way, the present invention is industrially advantageous.

What is claimed is:

1. A semiconductor circuit comprising:
   a monolithic circuit provided on a substrate and comprising an active-matrix circuit and a peripheral driver circuit;
   a transistor provided in said peripheral driver circuit and having an active region containing at least one catalytic element at a concentration of 1×10$^{15}$ to 1×10$^{19}$ cm$^{-3}$; and
   a transistor provided in said active-matrix circuit and having an active region containing said at least one catalytic element at a concentration lower than that of said active region of said transistor provided in said peripheral driver circuit.

2. The circuit of claim 1 wherein said at least one catalytic element in said active region of said transistor provided in said peripheral driver circuit has a concentration of 1×10$^{16}$ to 5×10$^{17}$ cm$^{-3}$.

3. The circuit of claim 1 wherein said at least one catalytic element in said active region of said transistor provided in said active-matrix circuit has a concentration of less than 1×10$^{15}$ cm$^{-3}$.

4. The circuit of claim 1 wherein said at least one catalytic element is at least one of nickel, iron, cobalt, and platinum.

5. The circuit of claim 1 wherein said concentration of said at least one catalytic element is defined by values measured by SIMS.

6. A semiconductor circuit including at least an active matrix circuit and a peripheral circuit for driving said active matrix circuit, said semiconductor circuit comprising:
   a substrate having an insulating surface;
   a first plurality of thin film transistors formed on said substrate for forming said active matrix circuit, each of which has an active region comprising a crystalline silicon semiconductor; and
   a second plurality of thin film transistors formed on said substrate for forming said peripheral circuit, each of which has an active region comprising a crystalline semiconductor,
   wherein the active region of said second plurality of thin film transistors contains a metal element selected from the group consisting of nickel, iron, cobalt and platinum while the active region of said first plurality of thin film transistors do not.

7. The semiconductor circuit of claim 6 wherein the active region of said second plurality of thin film transistors has a higher carrier mobility than said first plurality of thin film transistors.

8. The semiconductor circuit of claim 6 wherein the active region of said second plurality of thin film transistors has a higher crystallinity than said first plurality of thin film transistors.

9. A semiconductor circuit including at least an active matrix circuit and a peripheral circuit for driving said active matrix circuit, said semiconductor circuit comprising:
   a substrate having an insulating surface;
   a first plurality of thin film transistors formed on said substrate for forming said active matrix circuit, each of which has an active region comprising a crystalline silicon semiconductor; and
   a second plurality of thin film transistors formed on said substrate for forming said peripheral circuit, each of which has an active region comprising a crystalline semiconductor,
   wherein the active region of said second plurality of thin film transistors contains a metal element selected from the group consisting of nickel, iron, cobalt and platinum at a higher concentration than the active region of said first plurality of thin film transistors contains said metal element.

10. The semiconductor circuit of claim 9 wherein the active region of said second plurality of thin film transistor has a higher mobility than said first plurality of thin film transistors.

11. The semiconductor circuit of claim 10 wherein the active region of said second plurality of thin film transistors has a higher crystallinity than said first plurality of thin film transistors.

12. A semiconductor device comprising:
   a first thin film transistor having a first channel semiconductor region on a substrate; and a second thin film transistor having a second channel semiconductor region on said substrate, both of said first and second channel semiconductor regions having a crystallinity;

wherein a concentration of a catalyst metal contained in said first channel semiconductor region is larger than that in said second channel semiconductor region.

13. The semiconductor device of claim 12 wherein a ratio of the concentration of said catalyst metal in said first channel semiconductor region to that in said second channel semiconductor region is ten or more.

* * * * *